(12) United States Patent
Chen

(10) Patent No.: US 7,151,400 B2
(45) Date of Patent: Dec. 19, 2006

(54) BOOST-BIASED LEVEL SHIFTER

(75) Inventor: Ker-Min Chen, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 75 days.

(21) Appl. No.: 10/889,724

(22) Filed: Jul. 13, 2004

(65) Prior Publication Data

US 2006/0012415 A1    Jan. 19, 2006

(51) Int. Cl.
    *H03L 5/00*    (2006.01)
(52) U.S. Cl. .......................... 327/333; 326/68; 326/81
(58) Field of Classification Search ................ 327/52, 327/54, 55, 66, 67, 310, 313, 333; 326/68, 326/80, 81
    See application file for complete search history.

(56) References Cited

U.S. PATENT DOCUMENTS

| | | | | |
|---|---|---|---|---|
| 4,858,055 A * | 8/1989 | Okitaka | ...................... | 361/56 |
| 5,486,785 A * | 1/1996 | Blankenship | ................ | 327/306 |
| 6,064,227 A * | 5/2000 | Saito | .......................... | 326/68 |
| 6,333,682 B1 | 12/2001 | Umezawa et al. | | |
| 6,373,315 B1 * | 4/2002 | Tsuji et al. | ................ | 327/333 |
| 6,411,554 B1 * | 6/2002 | Kawai | .................... | 365/189.09 |
| 6,433,582 B1 | 8/2002 | Hirano | | |
| 6,556,061 B1 * | 4/2003 | Chen et al. | ................ | 327/333 |
| 6,614,283 B1 * | 9/2003 | Wright et al. | ............... | 327/333 |
| 6,639,427 B1 * | 10/2003 | Dray et al. | ................... | 326/83 |
| 6,642,769 B1 * | 11/2003 | Chang et al. | ............... | 327/333 |
| 6,650,168 B1 | 11/2003 | Wang et al. | | |
| 6,677,798 B1 | 1/2004 | Chang et al. | | |
| 6,774,673 B1 | 8/2004 | Tsuboi et al. | | |
| 6,774,698 B1 * | 8/2004 | Bhattacharya et al. | ....... | 327/333 |
| 2002/0175737 A1 * | 11/2002 | Debaty | ....................... | 327/333 |
| 2002/0180508 A1 * | 12/2002 | Kanno et al. | ............... | 327/333 |
| 2003/0011418 A1 * | 1/2003 | Nishimura et al. | ......... | 327/333 |
| 2003/0042965 A1 * | 3/2003 | Kanno et al. | ............... | 327/333 |
| 2003/0107425 A1 * | 6/2003 | Yushan | ....................... | 327/333 |

* cited by examiner

*Primary Examiner*—Quan Tra
*Assistant Examiner*—Thomas J. Hiltunen
(74) *Attorney, Agent, or Firm*—Slater & Matsil, L.L.P.

(57) ABSTRACT

A boost-biased level shifter is described. In the preferred embodiments of the present invention, a voltage divider circuit divides the high voltage applied on the receiver circuit that receives the input signal, a refresh and self-bias circuit maintains and refreshes a bias voltage that is high enough to turn on the transistors in the voltage divider circuit, and a voltage output circuit outputs a signal having the amplitude of a higher power supply source, which is higher than the input signal amplitude. The preferred embodiments can operate at input signals having a lower amplitude. The performance is improved.

11 Claims, 7 Drawing Sheets

BOOST-BIASED LEVEL SHIFTER

TECHNICAL FIELD

This invention relates generally to digital circuits, and more specifically to digital level shifters.

BACKGROUND

A level shifter is a circuit that converts an input signal having the voltage amplitude of $VDD_1$ into an output signal having the voltage amplitude of $VDD_2$. Typically, the amplitude is converted by fixing the lower potential side and converting the potential at the higher potential side. Level shifters are widely used in integrated circuits where more than one type of circuit, each with different operating voltage amplitudes, are integrated together.

A common application for a level shifter is shifting the voltage of a signal transferred between an IO circuit and a core circuit in an integrated circuit device. Traditionally, the IO operating voltage was compatible with the core operating voltage. However, with the shrinking of VLSI circuits, the operating voltage of core circuits has steadily been lowered, while the IO operating voltage has stayed relatively steady, so that currently, core operating voltage is typically much lower than IO operating voltage. For example, in deep micron technology, the core operating voltage has dropped to about 0.9 to 1V for a state of the art device, while the IO operating voltage is typically about 3.3V to 5.0V. Therefore, a signal needs to be level shifted (up) before it is sent from a core circuit to an IO circuit or (down) from an IO circuit to a core circuit.

FIG. 1 illustrates a conventional cross-latch level shifter circuit that converts an input signal with amplitude of VDD, which is, e.g., a core operating voltage, to a signal with amplitude of VDDIO, which is, e.g., an IO operating voltage that is higher than VDD. Node 2 is a power supply node at a power voltage VDDIO. Node 4 is at VSS, typically ground potential or 0V. Node 6 is an input node and node 8 is an output node. The input signal voltage at node 6 switches between 0V to VDD. If the input signal at input node 6 is 0, the nMOS transistor 14 is off, so that its drain voltage at node 24 is high. Inverter 18, whose input is low (0V) at node 6, outputs a high level (VDD) on its output, which is tied to node 22. Because node 22 is high, nMOS transistor 16 is on, thus pulling the output voltage at node 8 low. Conversely, if the input signal at the input node 6 is VDD, the nMOS transistor 14 is on so that its drain voltage 24 is low. The voltage at node 22 is converted to low by the inverter 18 so that the nMOS transistor 16 is off, and the output voltage at node 8 is pulled up by pMOS transistor 12 to VDDIO. Therefore, the input signal with amplitude of VDD is shifted to VDDIO.

The circuit illustrated in FIG. 1 performs well when the VDD is higher than the threshold voltage of the transistors 14 and 16 with an adequate margin. However, this circuit has several disadvantages. First, since the power supply voltage VDDIO is high, the transistors 10, 12, 14 and 16 are typically thick oxide transistors so that they can withstand higher operation voltages without being damaged. The thick oxide transistors have higher threshold voltages. To turn a thick oxide transistor 14 or 16 from off to on, the input signal at node 6, or its inverted signal at node 22, must rise higher than the threshold voltage. The circuit state transition is slow due to the high threshold voltages of the transistors 14 and 16. Second, with the scaling of the VLSI circuit, the gate oxide of the core CMOS gets thinner. The supply voltage VDD of the core CMOS is also lowered to protect the gate oxide from damage and the hot carrier effect. When VDD is dropped to equal to or lower than the threshold voltage of nMOS 14 and 16, the input signal with amplitude of VDD is not high enough to turn on the transistors 14 and 16, and the conventional low-to-high level shifter fails.

The circuit illustrated in FIG. 1 has been modified in the art to solve the above-described shortcomings. FIG. 2 illustrates a typical modified circuit. The input signal at node 6 is coupled to a thin oxide nMOS transistor 36 and the inverted input signal is coupled to a thin oxide nMOS transistor 38. If the drains of transistors 38 and 36 are directly connected to nodes 8 and 24, respectively, the circuit may work, but the thin oxide transistors 36 and 38 may be damaged since their drain voltage may be as high as VDDIO. A voltage divider circuit is added to divide the voltages applied to transistors 36 and 38 so that transistors 36 and 38 always work under a desired operation voltage. The voltage divider circuit is composed of transistors 26, 28, 30, and 32. Transistors 26 and 28 are native transistors. Native transistors sit in a wafer substrate or in wells of the same type as the substrate. They typically have low threshold voltages that are close to zero volts. In this circuit, native transistors 26 and 28 have negative threshold voltage, so that they are always on even when the input signal or inverted input signal applied on their gates is 0 volts. Transistors 30 and 32 are biased at VDD. The transistors 26, 28, 30 and 32 have voltage drops between their sources and drains. The design of the circuit ensures that the drain voltages of the transistors 36 and 38, which are VDDIO minus the voltage drops on transistors 26, 28, 30, and 32, are close to the core operation voltage VDD. Therefore, thin oxide transistors 36 and 38 can be used in the level shifter to improve circuit performance without compromising circuit reliability.

However, the process of making the level shifter shown in FIG. 2 has more steps, and production cost is higher since there is an extra type of device to be formed. The native transistors 26 and 28 have higher leakage current than the normal transistors. They also take up more space and their size does not shrink in correspondence with the shrinking of the size of the integrated circuit, so the leakage current will be more significant.

What is needed, therefore, is a level shifter that overcomes the above described shortcomings in the prior art.

SUMMARY OF THE INVENTION

A boost-biased level shifter is described. In the preferred embodiments of the present invention, a voltage divider circuit divides the high voltage applied on the receiver circuit that receives the input signal, a refresh and self-bias circuit maintains and refreshes a bias voltage that is high enough to turn on the transistors in the voltage divider circuit, and a voltage output circuit outputs a signal having the amplitude of a higher power supply source, which is higher than the input signal amplitude.

In one aspect of the preferred embodiment, the voltage divider circuit comprises cascaded nMOS thick oxide transistors and thin oxide transistors. During normal operation, these transistors share the voltages that are applied to the transistors in the input receiver circuit. The self-bias circuit comprises a body-effect thick oxide pMOS transistor to boost the bias voltage higher and an nMOS thin oxide transistor. The refresh circuit comprises a pair of thick oxide pMOS transistors. When the input voltage is stable, the refresh circuit is off since one of the thick oxide pMOS transistors is off, and the circuit draws no current. During the state transition period, the refresh circuit refreshes the bias voltage to a desired level.

In another aspect of the preferred embodiment, a fail proof circuit is added. The fail proof circuit comprises a pair of thick oxide nMOS transistors having their gates coupled to the input signal and the inverted input signal and their drains coupled to the output node and a complementary node of the output node. The fail proof circuit works in parallel with the input receiver circuit and the voltage divider circuit. It prevents the preferred embodiment from failure caused by the DC input signal. Since this embodiment has an additional fail proof circuit, the performance is also better.

Yet in another aspect, a pair of capacitors is used to establish two bias voltages. The bias voltages are complementary and higher than the threshold voltages of the thick nMOS transistors. This embodiment does not need a refresh since the bias voltages are maintained by capacitors.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiments are illustrated in FIGS. 3 through 6 wherein like reference numbers are used to designate like elements throughout the various views and illustrative embodiments of the present invention. The nodes in the circuit illustrated are represented with numerical values.

Figure 3:
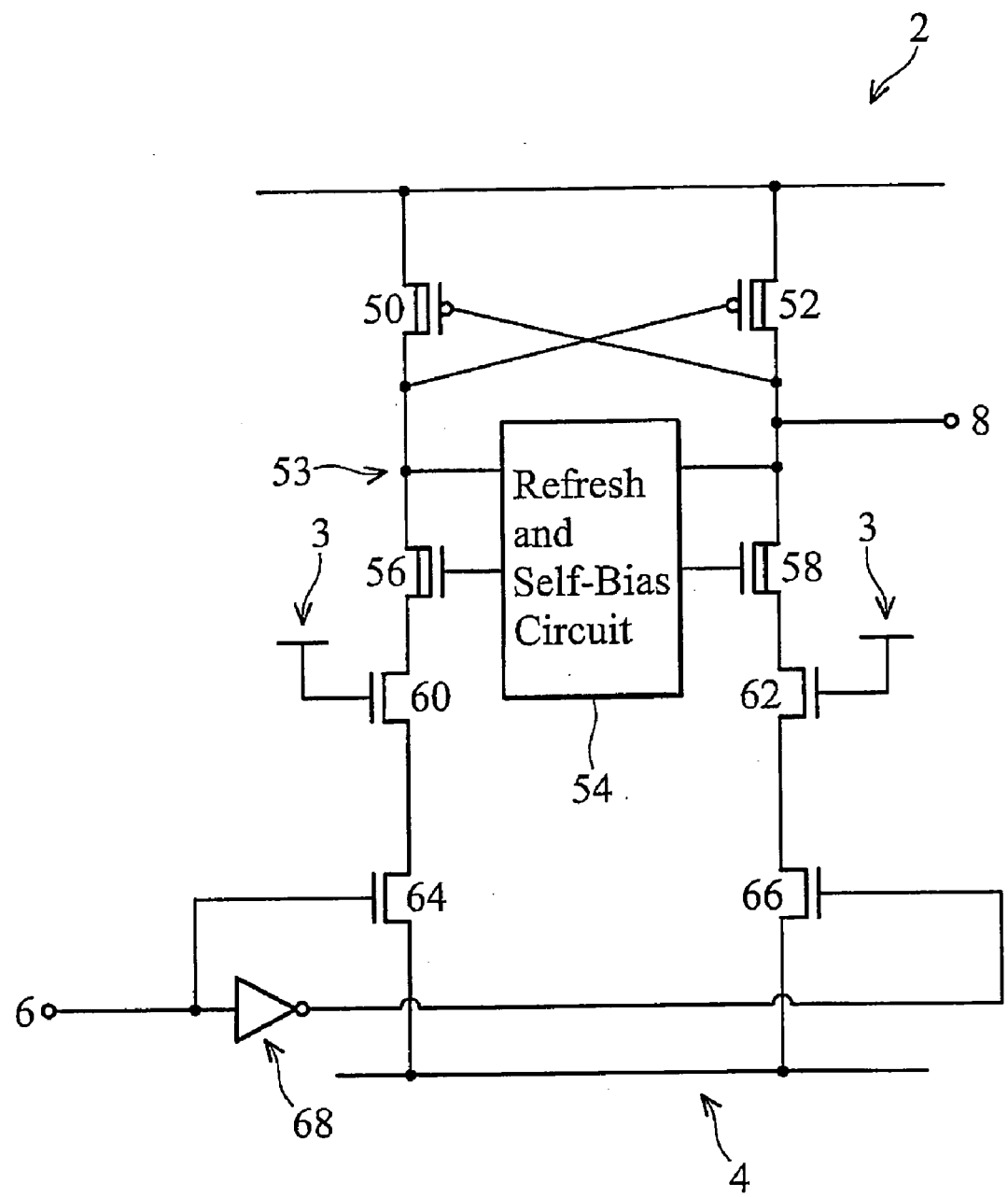
FIG. 3 illustrates a schematic diagram of the preferred embodiment.

FIG. 3 illustrates a schematic view of a preferred embodiment of the present invention. Node 2 is coupled to a high voltage VDDIO, and node 4 is coupled to a VSS, typically the ground potential or 0V. Node 6 is the signal input node and node 8 is the signal output node. The input signal, as is conventional, consists of a logical pair of voltage levels, i.e., logical low and logical high. In the illustrated embodiments, a logical low is about 0V and a logical high is about the VDD (e.g., 1V) voltage level for a core device. The output signal also consists of a logical pair of voltage levels, logical low and logical high, and, in the illustrated embodiment, the logical low at the output is about 0V and the logical high at the output is about the VDDIO (e.g., 3.3V) for an IO device. Thick oxide pMOS transistor 56 and thin oxide nMOS transistor 60 form a voltage divider circuit. Likewise, thick oxide pMOS transistor 58 and thin oxide nMOS transistor 62 form a voltage divider circuit. Since transistors 56 and 58 have high threshold voltages, their gates are coupled to boosted bias voltages generated by a refresh and self-bias circuit 54.

Transistors 64 and 66 are thin nMOS transistors, and they form an input signal receiver circuit. The input signal at node 6 is coupled to the gate of the thin nMOS transistor 64, and its inverted voltage is coupled to the gate of another thin nMOS transistor 66 via inverter 68. Thick PMOS transistors 50 and 52 form a latch, which is typically used in the level shifter circuit. The drain of the transistor 52 is coupled to the output node 8.

The bias voltages provided to the gates of transistors 56 and 58 may be the same or complementary. In either case, the bias voltages are high enough to turn on the thick oxide transistors 56 and 58. However, if the bias voltages are too high, the drain voltages of transistors 60 and 62 are too high, and the thin oxide transistors 60 and 62 may be damaged. Therefore, the bias voltages are preferably maintained in a desired range of between about VDD+$V_{tpd}$ and 2*VDD+$V_{tpd}$.

The bias voltages may drop if the input signal is a DC or a very low frequency signal, as will be explained in detail in subsequent paragraphs. The bias voltages need to be refreshed by a refresh circuit (shown as 54). Although FIG. 3 illustrates that the refresh and self-bias circuit 54 is coupled to the output node 8, its complementary node 53, and the gates of transistors 50 and 52, it may be coupled to other nodes in the circuit. Which nodes are to be coupled is determined by the implementation of the embodiments.

Figure 4:
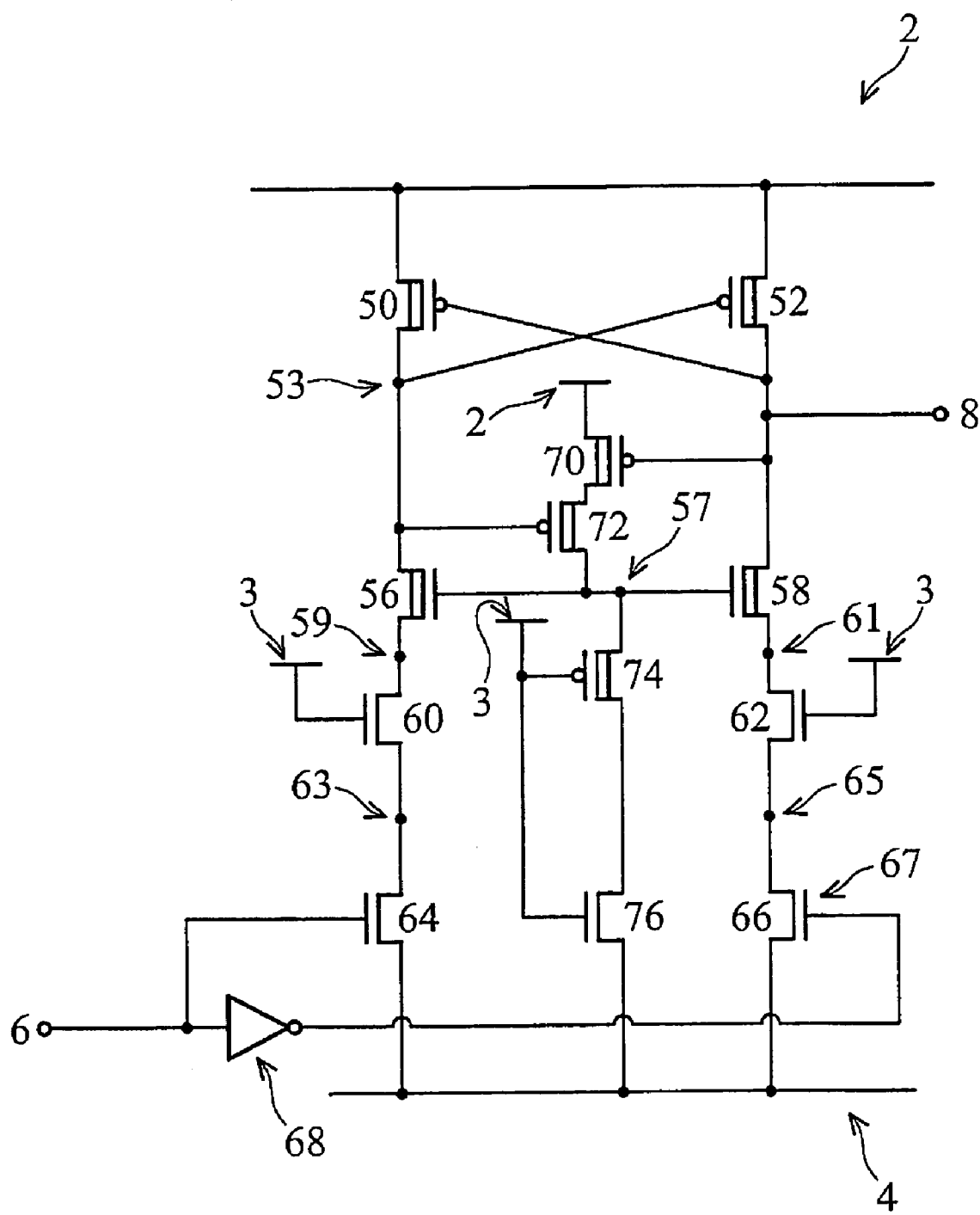
FIG. 4 illustrates an implementation of the preferred embodiment.

FIG. 4 illustrates one preferred embodiment where the refresh and self-bias circuit 54 shown in FIG. 3 is implemented by transistors 70, 72, 74 and 76. The refresh and self-bias circuit 54 is composed of a refresh circuit and a self-bias circuit. The self-bias circuit is implemented by a thick pMOS body-effect transistor 74 and an nMOS transistor 76. The gates of the transistors 74 and 76 are coupled to a power supply node 3 at a voltage VDD. During normal operation, transistors 74 and 76 are both on. The bias voltage $V_{bias}$ at node 57 is raised by transistor 74 to VDD+$V_{tpd}$, where $V_{tpd}$ is the threshold voltage of the transistor 74. Transistor 74 is a body-effect transistor, and it has a high threshold voltage, typically at about 0.8–0.9V. Transistor 76 serves two purposes. The first is to help with raising the $V_{bias}$ if VDDIO is powered on before VDD. If VDDIO is powered on before VDD, the gate voltage of the transistor 76 is 0, so it is off, and the voltage $V_{bias}$ at node 57 can be pulled up to VDD+$V_{tpd}$ easily. The second purpose is to prevent an ESD path from being formed through the body-effect pMOS transistor 74. Since the body of the body-effect transistor 74 is coupled to VDDIO, if an ESD transient occurs at VSS, the ESD current flows from VSS at node 4 to transistor 74, possibly damaging the transistor 74. The coupling of transistor 76 between VSS at node 4 and transistor 74 is equivalent to adding two back-to-back diodes in the path. The diodes shut down the current path for the ESD current, and the ESD current will flow through the ESD protection circuit instead of the transistor 74.

Without transistors 70 and 72, the node 57 will be floating. Transistors 70 and 72 form the refresh circuit to maintain the voltage $V_{bias}$ at node 57. Since nodes 53 and 8 are complementary, the voltages at nodes 53 and 8 are complementary. When the input signal switches, the voltage at one of the nodes 53 and 8 switches from 0 to VDDIO and the other switches from VDDIO to 0. Therefore, there is a short period when both transistors 70 and 72 are on, and there is a current flowing from transistor 70 to 72. This current brings $V_{bias}$ at node 57 back to VDD+$V_{tpd}$. Therefore the $V_{bias}$ is refreshed. The reason the refresh circuit is needed is explained in detail in subsequent paragraphs. After the switching finishes (static state), the voltages at nodes 53 and 8 are either 0 or VDDIO, so that one of the transistors 70 and 72 is on and the other one is off. The current path is cut off by the transistor that is off. Therefore, at static states, there is no power consumption by the transistors 70 and 72.

The combination of the bias voltage at node 57 and the voltage divider circuit ensures that any of the gate-to-drain or gate-to-source voltages of the transistors 60, 62, 64 and 66 are close to the core operation voltage VDD. The reason can be explained as follows. Assume that the initial voltage of the input signal at node 6 is 0, the inverted voltage at node 67 is VDD, and the transistor 66 is on. The voltage at node 65 is 0. The voltage at node 61 is also 0 since the gate to source voltage of the transistor 62 is VDD and transistor 62 is on. The voltage at node 8 is 0 since the gate to source voltage of transistor 58 is VDD+$V_{tpd}$, so that transistor 58 is on. Therefore, transistors 62 and 66 are operated with their gate-to-source and gate-to-drain voltages not higher than VDD. When the input signal at node 6 switches to VDD, the inverted voltage at node 67 switches to 0, cutting off the transistor 66. The output voltage at node 8 rises to VDDIO eventually. During the rising of output voltage at node 8, since the initial voltages at nodes 61 and 65 are 0 volts and initially transistors 58 and 62 are on, the voltages at nodes 61 and 65 rise as well. However, the rising of the voltage $V_{61}$, at node 61 stops when $V_{61}$ equals $V_{bias}-V_{tnd}$, where $V_{tnd}$ is the threshold voltage of transistor 58. At this time, transistor 58 cuts off since its gate to source voltage equals its threshold voltage $V_{tnd}$. Therefore, the voltage $V_{61}$, at node 61 is restricted to a maximum value of $V_{bias}-V_{tnd}$, even though the voltage at node 8 continues to rise to VDDIO. Similar analysis reveals that the voltage at node 65 has a maximum value of VDD-$V_{tnt}$, where $V_{tnt}$ is the threshold voltage of transistor 62, since at this voltage, the transistor 62 cuts off and the voltage at node 65 cannot rise further. In a typical case, VDDIO is 3.3V, VDD is 1.0V, and the threshold voltage $V_{tpd}$ of the body effect transistor 74 is 0.9V, so that $V_{bias}$ is 1.9V. The threshold voltage $V_{tnd}$ of the transistor 58 is about 0.7V, and the voltage at node 61 has a maximum value of 1.2V. The threshold voltage of transistor 62 is typically 0.3V, so that the voltage at node 61 has a maximum value of 0.7V. From the above analysis, it is noted that transistors 62 and 66 are both operated at voltages close to VDD, and their gate to source, gate to drain voltages are lower than VDD. Similarly, thin oxide transistors 60 and 64 also operate at voltages no higher than VDD.

The embodiment shown in FIG. 4 works well at an AC signal since the $V_{bias}$ is refreshed frequently. However, if the frequency is so low that the input signal at node 6 does not switch for a long time (i.e, days), due to the leakage current in transistors 74 and 76, the voltage at node 57 drops. The transistor 74 is a thick oxide transistor and the leakage current is small, so that the voltage dropping is slow. However, eventually the bias voltage at node 57 will drop to 0 if the input signal at node 57 never switches. When the bias voltage $V_{bias}$ at node 57 is lower than the threshold voltages of transistors 56 and 58, then both transistors are off, the voltages at nodes 53 and 8 are all high, and the output signal at node 8 may be at a wrong state. Also, since the voltages at nodes 53 and 8 are all high, the transistors 70 and 72 are both off. Even when the input signal at node 6 switches later, the voltages at nodes 53 and 8 do not change, so that the transistors 70 and 72 do not refresh bias voltage $V_{bias}$. Also since bias voltage $V_{bias}$ is not refreshed, the voltages at nodes 8 and 53 stay high. The circuit is locked and the embodiment shown in FIG. 4 fails.

Figure 1:
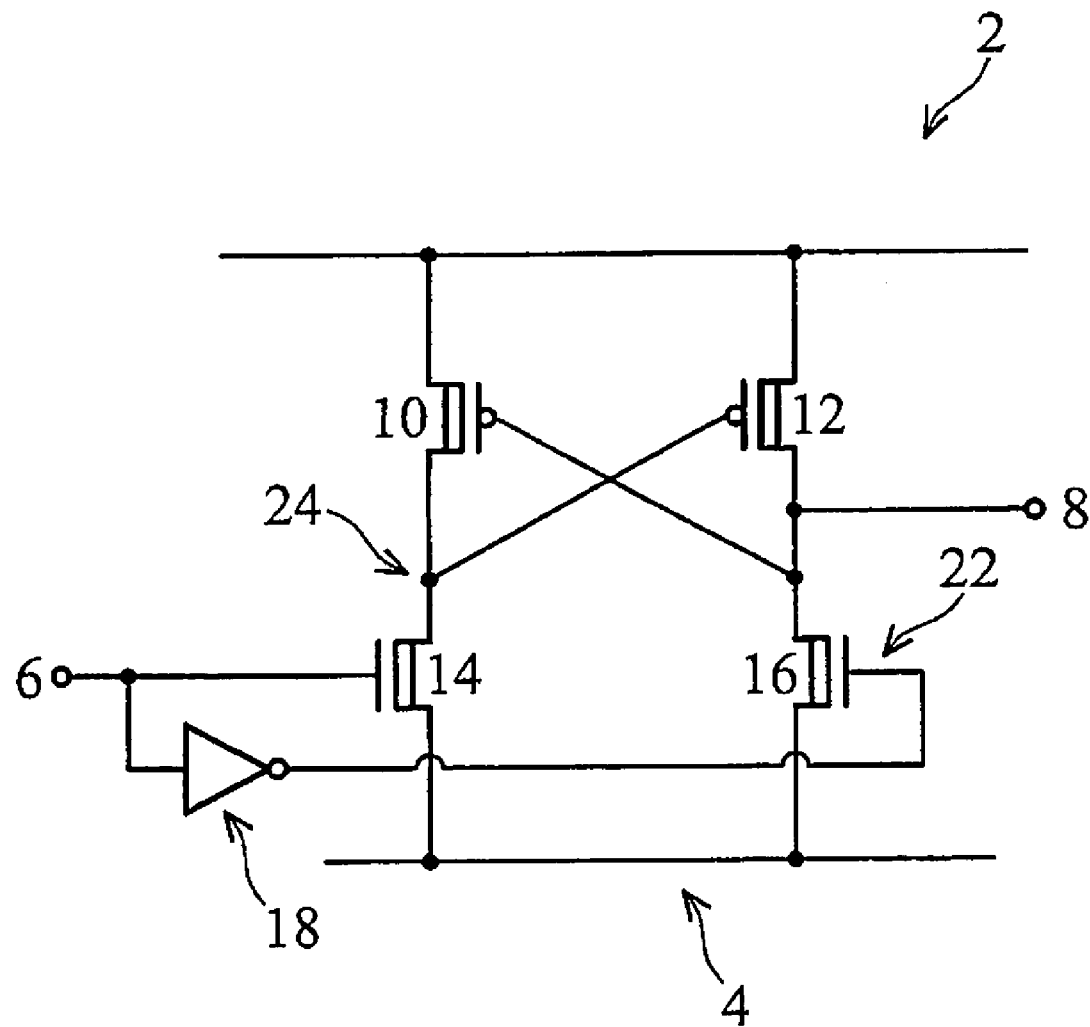
FIG. 1 illustrates a conventional cross latch level shifter.
Figure 2:
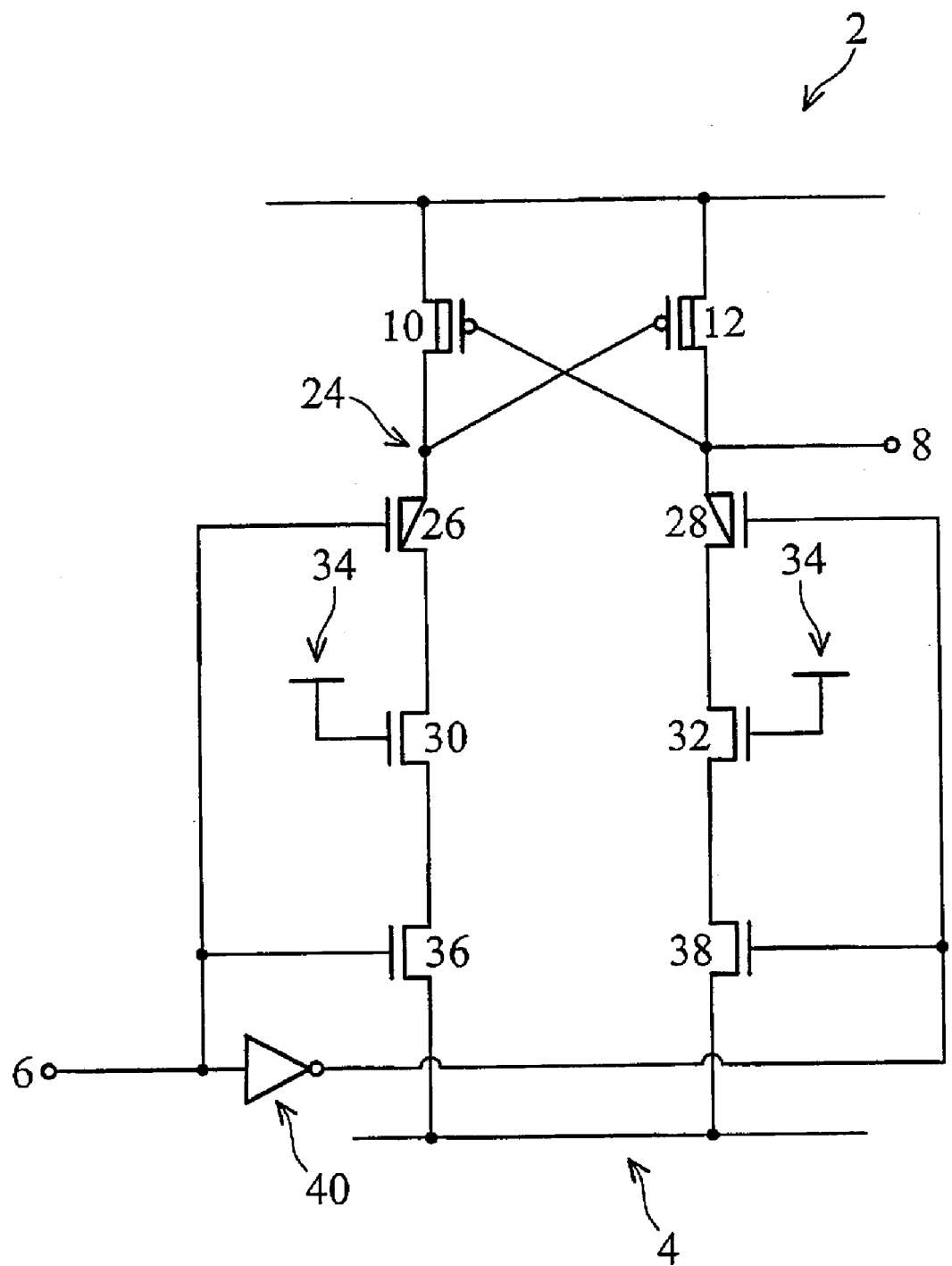
FIG. 2 illustrates a conventional level shifter using native transistors.
Figure 5:
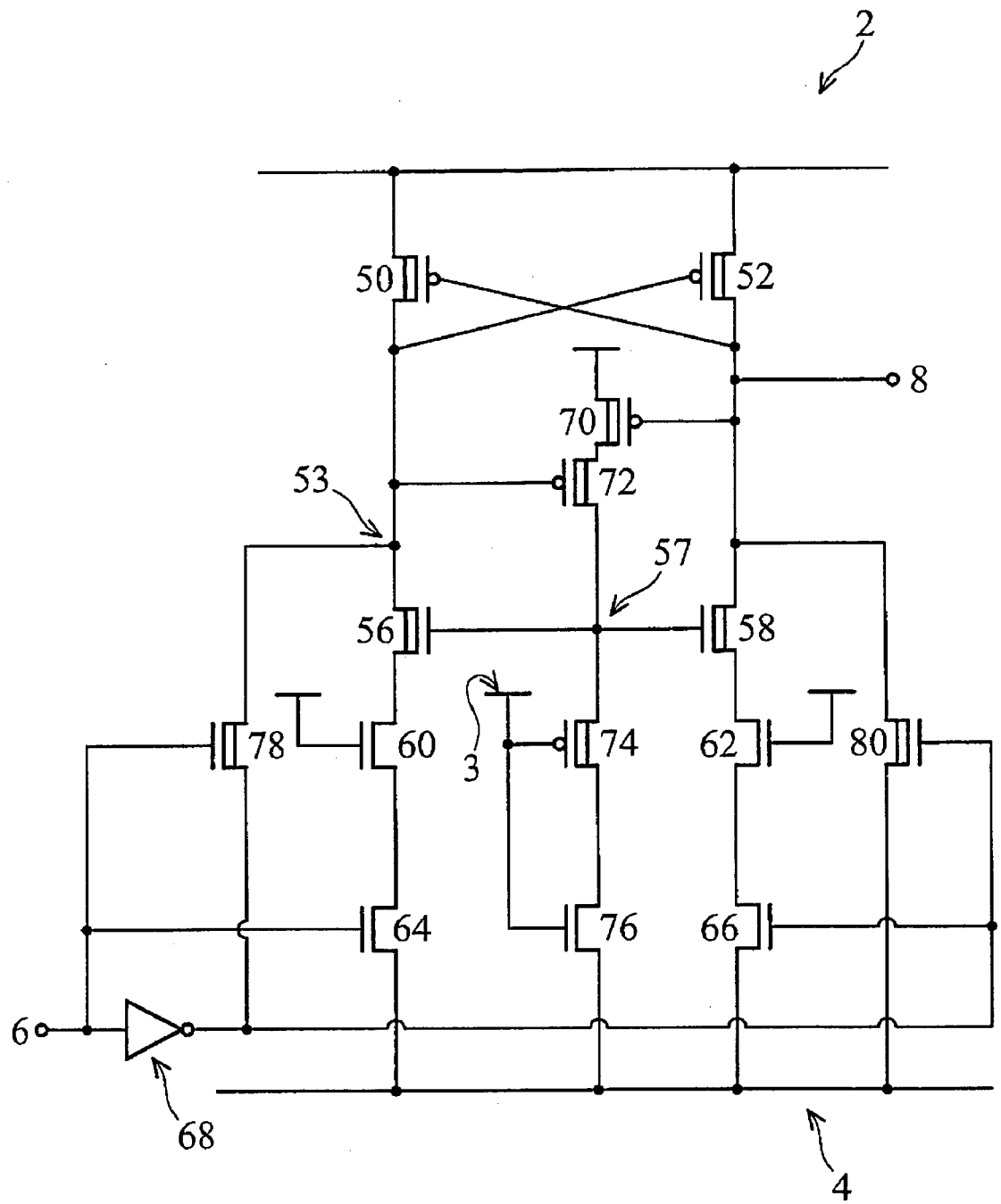
FIG. 5 illustrates a preferred embodiment with a fail proof circuit.

In order to expand the working range of the preferred embodiment to low frequency and DC signals, modifications are made to form a fail-proof embodiment as illustrated in FIG. 5. The embodiment in FIG. 5 is similar to the embodiment shown in FIG. 4 except that a fail proof circuit composed of a pair of pMOS transistors 78 and 80 is added. Transistor 78 is coupled in parallel to transistors 56, 60 and 64. Transistor 80 is coupled in parallel to transistors 58, 62 and 66. It is observed that this embodiment is the hybrid of the prior art shown in FIG. 1 and the embodiment shown in FIG. 4. When VDD is low, the sub circuit formed of transistors 56, 60 and 64 plays a bigger role than transistor 78, and the sub circuit of transistors 58, 62 and 66 plays a bigger role than transistor 80 since the circuits formed of the transistors 56, 60, 64, 58, 62 and 66 are designed to work better with the lower voltage input signal. When VDD is high, both parts work together so that the circuit reacts more quickly.

This embodiment is fail proof from low frequency or DC input signals. Assuming the frequency of the input signal at node 6 is very low, causing $V_{bias}$ to drop and the gate-to-source voltages of transistors 56 and 58 to be below their threshold voltages, both transistors 56 and 58 are off, and the circuit formed of transistors 56, 58, 60, 62, 64 and 66 does not function. However, the fail proof circuit formed of transistors 78 and 80 works with transistors 50 and 52 to generate an output signal with a correct state. Therefore, this embodiment operates normally even when part of its circuit fails. The fail proof circuit can bring the failed circuit back to normal operation. When the signal switches states, transistors 78 and 80 also switch states, causing the nodes 53 and 8 to switch states. During the state switching of nodes 53 and 8, there is a short period when both transistors 78 and 80 conduct so that the voltages at nodes 53 and 8 are lower than VDDIO-$V_{tpd}$, and the transistors 70 and 72 both conduct. A current flows through transistors 70 and 72, the voltage $V_{bias}$ at node 57 is brought back to VDD+$V_{tpd}$, and the level shifter continues functioning.

Figure 6:
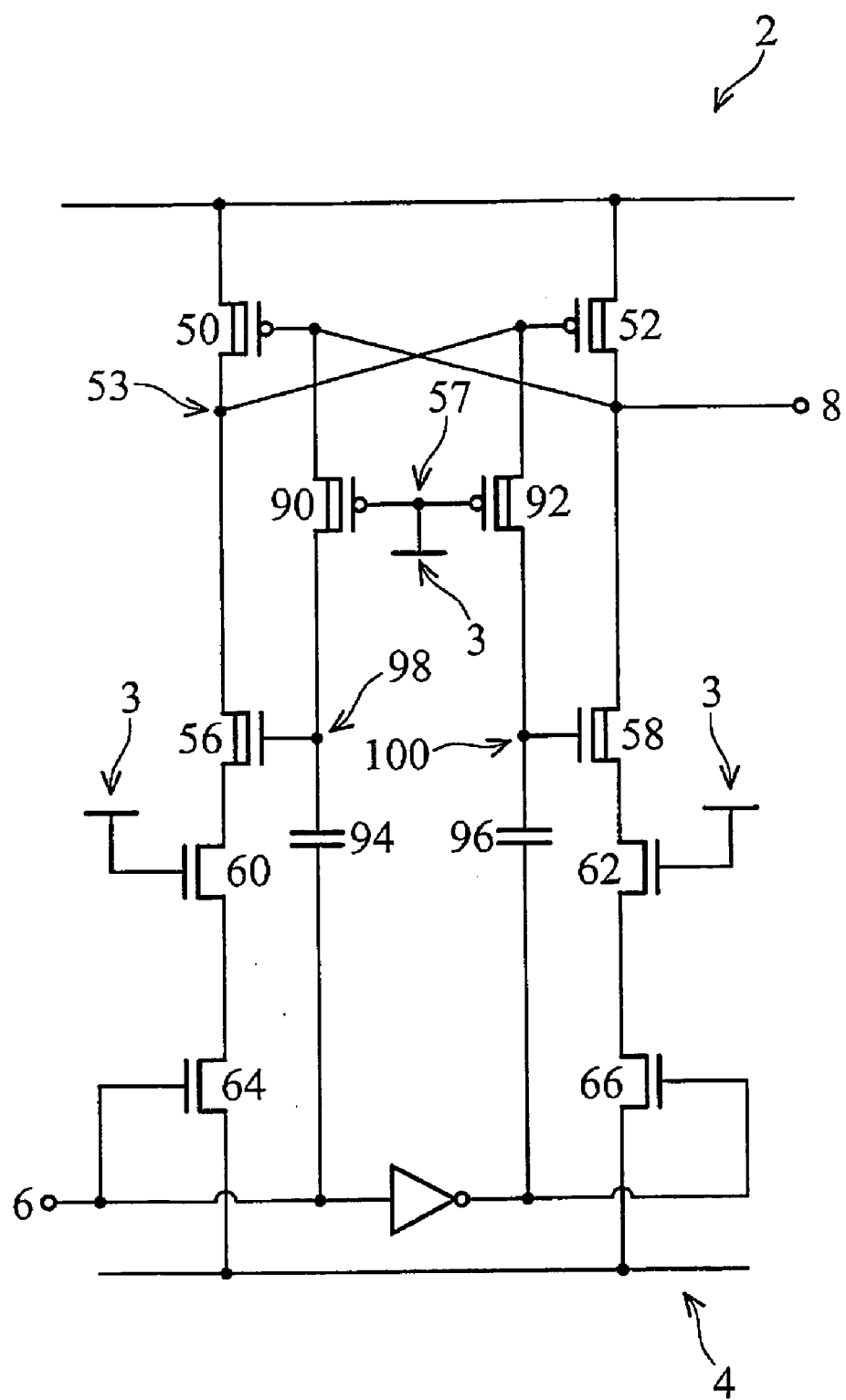
FIG. 6 illustrates a preferred embodiment using capacitors.

Although the embodiment illustrated in FIG. 5 is fail-proof and its performance is improved, it uses more transistors to achieve this goal. A preferred embodiment that simplifies the design of the fail-proof level shifter is illustrated in FIG. 6. This embodiment uses a pair of differential bias voltages to drive transistors 56 and 58. A pair of capacitors 94 and 96 is used to maintain a bias voltage $V_{98}$ at node 98 and a complementary bias voltage $V_{100}$ at node 100. Since the bias voltages $V_{98}$ and $V_{100}$ do not drop, the circuit is fail proof. Capacitors 94 and 96 are preferably formed of pMOS transistors with their sources and drains connected, preferably to their bodies. The gates of pMOS transistors 90 and 92 are coupled to the power source VDD at node 3. Assuming the input voltage at node 6 is VDD so that the output voltage at node 8 is VDDIO, the transistor 90 conducts since it has a source voltage VDDIO and a gate voltage VDD. The voltage $V_{98}$ at node 98 is brought up to VDDIO. If the input signal at node 6 switches to 0, the voltage at node 8 drops, and the voltage $V_{98}$ at node 98 follows the dropping of the voltage at node 8. When the voltage at node 8 drops to VDD+$V_{tpd}$, where $V_{tpd}$ is the threshold voltage of transistor 90, the transistor 90 cuts off, and the voltage at node 98 is maintained at VDD+$V_{tpd}$.

Similar analysis applies to transistor 92, and it is found that the voltages at nodes 98 and 100 are between VDD+$V_{tpd}$ and VDDIO. Also, the bias voltages at nodes 98 and 100 are at opposite phases, or complementary, so that when one is at voltage VDD+$V_{tpd}$, the other is at voltage VDDIO. Since the bias voltages $V_{98}$ and $V_{100}$ are maintained by the capacitors 94 and 96, they do not drop even when the input signal at node 6 is a DC signal. No refresh circuit is required.

Since the gates of the transistors 98 and 100 are at least VDD+$V_{tpd}$, transistors 56 and 58 conduct. The operation of this embodiment is similar to the embodiment shown in FIG. 3, so that it is not repeated.

Figure 7:
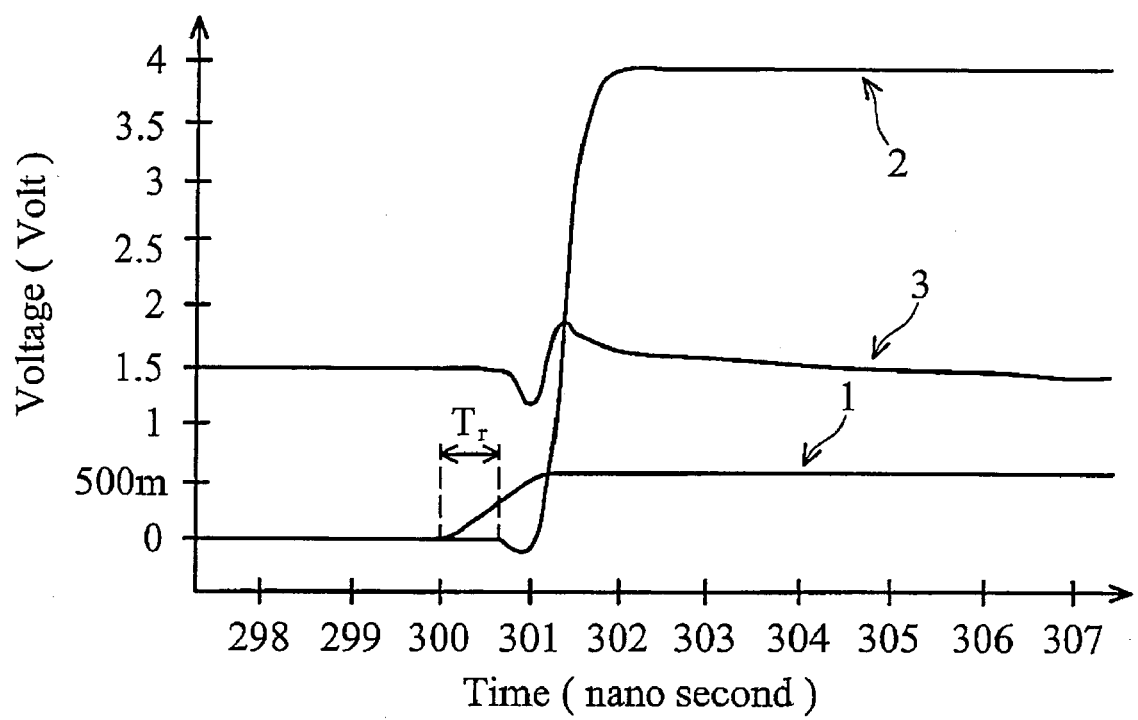
FIG. 7 illustrates the voltages at different nodes of the preferred embodiment as a function of time.

The preferred embodiment described above has been tested and one of the results is shown in FIG. 7. The voltages at different nodes of the preferred embodiment are shown as a function of time. VDD is 0.6V, and VDDIO is 4.0V. Line 1 is the input signal at node 6, which switches from about 0V to about 0.6V. Line 2 is the level shifted output signal at node 8, which switches from about 0V to about 4.0V. Line 3 is $V_{bias}$, at node 57. During the period when the input signal switches, the voltage at node 57 fluctuates between about 1.3V and 1.8V. If the input signal is stable, $V_{bias}$ is about 1.45V, which equals 0.6V (VDD) plus 0.85V ($V_{tpd}$). The circuit response times $T_r$, measured from the time the input signal at node 6 starts changing state to the time the output signal at node 8 starts changing state, are less than 2 ns (1 ns in FIG. 7).

The preferred embodiments of the present invention have several advantageous features. First, they can be used to shift voltage from an input signal with an amplitude as low as about 0.5V to a high amplitude as high as about 4.0V. Second, the performance is improved by boosted bias voltage. The preferred embodiments have a response time of less than 2 ns for transferring a signal from 0.6V to 4.0V.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A level shifter comprising:
a first power supply node at a first supply voltage;
a second power supply node at a second supply voltage wherein the second supply voltage is higher than the first supply voltage;
an input node configured to receive an input signal;
an output node;
a bias node at a bias voltage;
an output circuit coupled to the bias node, the first power supply node, the second power supply node and the output node;
a self-bias circuit maintaining the bias voltage, wherein the self-bias circuit comprises a bias-raising circuit to raise the bias voltage, and wherein the bias-raising circuit comprises a body-effect thick oxide pMOS transistor having its gate coupled to the first power supply node and its source coupled to the bias node, and further comprises an nMOS transistor coupled in series to the bias-raising circuit preventing ESD current from flowing through the self-bias circuit; and
a refresh circuit coupled to the bias node and refreshing the bias voltage during a transition period of time when the input signal changes state, the refresh circuit being in an off state during a non-transition period of time of the input signal.

2. The level shifter of claim 1 wherein the refresh circuit comprises:
a first thick oxide pMOS transistor having its drain coupled to the source of a second thick oxide pMOS transistor, its gate coupled to the output node and its source coupled to the second power supply node; and
the second thick oxide pMOS transistor having its gate coupled to a complementary node of the output node and its drain coupled to the bias node.

3. The level shifter of claim 1 wherein the output circuit comprises:
an input receiver circuit having a first input coupled to the input node and a second input coupled to an inverted input node;
a voltage divider circuit sharing the voltage applied to the input receiver circuit and coupled in series to the input receiver circuit; and
a latch coupled to the output node and a complementary node of the output node.

4. The level shifter of claim 3 wherein:
the input receiver circuit comprises a first thin oxide nMOS transistor coupled to the input node and a second thin oxide nMOS transistor coupled to the inverted input node;
the voltage divider circuit comprises a first and a second thick oxide nMOS transistor and a pair of thin oxide nMOS transistors;
wherein the first and second thick oxide nMOS transistors have their gates coupled to the bias node;
wherein the bias voltage at the bias node is higher than the threshold voltages of the first and second thick oxide nMOS transistors;
wherein each of the thin oxide nMOS transistors is coupled in series with one of the thick oxide nMOS transistors and has its gate coupled to the first power supply node;
the latch comprises a first and a second thick pMOS transistor, the first and the second thick pMOS transistors having their sources coupled to the second power supply node and their drains coupled to the drains of the thick oxide nMOS transistors, respectively; and
wherein the drain of the second thick oxide pMOS transistor is coupled to the output node.

5. The level shifter of claim 1 further comprising a fail proof circuit.

6. The level shifter of claim 5 wherein the fail proof circuit comprises:
a first thick oxide nMOS transistor having its gate coupled to the input node and its drain coupled to a complementary node of the output node; and
a second thick oxide nMOS transistor having its gate coupled to an inverted input node and its drain coupled to the output node.

7. The level shifter of claim 1 further comprising a complementary bias node at a complementary bias voltage, wherein the self-bias circuit comprises:
- a first thick oxide pMOS transistor having its source coupled to the output node, its gate coupled to the first power supply node and its drain coupled to the bias node; and
- a second thick oxide pMOS transistor having its source coupled to a complementary node of the output node, its gate coupled to the first power supply node and its drain coupled to the complementary bias node.

8. A method of level shifting a signal comprising:
- inputting an input signal to drive an input receiver circuit having applied voltages;
- establishing a boosted bias voltage;
- refreshing the boosted bias voltage only when the input signal changes state;
- using the thick oxide nMOS transistor to divide the applied voltages of the input receiver circuit;
- further dividing the applied voltages of the input receiver circuit using an nMOS transistor wherein the nMOS transistor is turned on by applying a power supply voltage at its gate; and
- driving an output circuit to generate an output signal having an amplitude of a high power supply voltage, wherein the output circuit is operated at the high power supply voltage.

9. The method of claim 8 wherein the steps of generating and refreshing the boosted bias voltage are performed by a refresh and self-bias circuit.

10. A level shifter comprising:
- a first power supply node at a first supply voltage;
- a second power supply node at a second supply voltage wherein the second supply voltage is higher than the first supply voltage;
- an input node configured to receive an input signal;
- an output node;
- a bias node at a bias voltage and a complementary bias node at a complementary bias voltage;
- an output circuit coupled to the bias node, the first power supply node, the second power supply node and the output node;
- a self-bias circuit maintaining the bias voltage to the output circuit coupled to the bias node, wherein the self-bias circuit comprises:
  - a first thick oxide pMOS transistor having its source coupled to the output node, its gate coupled to the first power supply node and its drain coupled to the bias node; and
  - a second thick oxide pMOS transistor having its source coupled to a complementary node of the output node, its gate coupled to the first power supply node and its drain coupled to the complementary bias node; and
- a refresh circuit refreshing the bias voltage coupled to the bias node, wherein the refresh circuit comprises:
  - a first capacitor having a first end coupled to the input node and a second end coupled to the bias node; and
- a second capacitor having a first end coupled to the inverted input node and a second end coupled to the complementary bias node.

11. The level shifter of claim 10 wherein the first and the second capacitors are formed of thick oxide pMOS transistors having their sources connected to their drains.

* * * * *

UNITED STATES PATENT AND TRADEMARK OFFICE
CERTIFICATE OF CORRECTION

PATENT NO.         : 7,151,400 B2
APPLICATION NO. : 10/889724
DATED                : December 19, 2007
INVENTOR(S)       : Chen It is certified that error appears in the above-identified patent and that said Letters Patent is hereby corrected as shown below:

On the title page
Item 56, line 6: delete "6,333,682 B1" insert --6,333,662 B1--

Signed and Sealed this

Tenth Day of April, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,151,400 B2 | Page 1 of 1 |
| APPLICATION NO. | : 10/889724 | |
| DATED | : December 19, 2006 | |
| INVENTOR(S) | : Chen | |

It is certified that error appears in the above-identified patent and that said Letters Patent is hereby corrected as shown below:

On the title page
Item 56, line 6: delete "6,333,682 B1" insert --6,333,662 B1--

This certificate supersedes Certificate of Correction issued April 10, 2007.

Signed and Sealed this

Eighth Day of May, 2007

JON W. DUDAS
*Director of the United States Patent and Trademark Office*